(12) United States Patent
Feyh et al.

(10) Patent No.: US 9,194,882 B2
(45) Date of Patent: Nov. 24, 2015

(54) INERTIAL AND PRESSURE SENSORS ON SINGLE CHIP

(71) Applicant: Robert Bosch GmbH, Stuttgart (DE)

(72) Inventors: Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/447,696

(22) Filed: Jul. 31, 2014

(65) Prior Publication Data

US 2015/0035093 A1 Feb. 5, 2015

Related U.S. Application Data

(60) Provisional application No. 61/862,370, filed on Aug. 5, 2013.

(51) Int. Cl.
| | |
|---|---|
| *B81B 3/00* | (2006.01) |
| *G01P 15/08* | (2006.01) |
| *G01P 15/14* | (2013.01) |
| *G01P 1/02* | (2006.01) |
| *G01P 15/125* | (2006.01) |
| *G01L 1/14* | (2006.01) |
| *G01L 1/18* | (2006.01) |

(52) U.S. Cl.
CPC .............. *G01P 15/0802* (2013.01); *G01L 1/14* (2013.01); *G01L 1/18* (2013.01); *G01P 1/023* (2013.01); *G01P 15/125* (2013.01); *G01P 15/14* (2013.01); *B81B 3/0021* (2013.01); *G01P 2015/088* (2013.01); *G01P 2015/0862* (2013.01)

(58) Field of Classification Search
CPC .. B81B 7/0077; B81B 3/0021; G01P 15/0802

USPC .......................................................... 257/415
See application file for complete search history.

(56) References Cited

U.S. PATENT DOCUMENTS

| | | | |
|---|---|---|---|
| 2006/0101912 A1 | 5/2006 | Wu et al. | |
| 2008/0277746 A1* | 11/2008 | Hsu et al. | 257/414 |
| 2011/0057236 A1* | 3/2011 | Feyh | 257/254 |
| 2011/0159627 A1 | 6/2011 | Mantravadi et al. | |
| 2012/0186354 A1 | 7/2012 | Okada | |
| 2012/0256282 A1 | 10/2012 | Lin et al. | |
| 2012/0299127 A1 | 11/2012 | Fujii et al. | |
| 2014/0015123 A1* | 1/2014 | Bowles et al. | 257/737 |

OTHER PUBLICATIONS

International Search Report and Written Opinion corresponding to PCT Application No. PCT/US2014/049210, mailed Nov. 12, 2014 (15 pages).

\* cited by examiner

*Primary Examiner* — Nathan Ha
(74) *Attorney, Agent, or Firm* — Maginot Moore & Beck LLP

(57) ABSTRACT

In one embodiment, the process flow for a capacitive pressures sensor is combined with the process flow for an inertial sensor. In this way, an inertial sensor is realized within the membrane layer of the pressure sensor. The device layer is simultaneously used as z-axis electrode for out-of-plane sensing in the inertial sensor, and/or as the wiring layer for the inertial sensor. The membrane layer (or cap layer) of the pressure sensor process flow is used to define the inertial sensor sensing structures. Insulating nitride plugs in the membrane layer are used to electrically decouple the various sensing structures for a multi-axis inertial sensor, allowing for fully differential sensing.

12 Claims, 8 Drawing Sheets

INERTIAL AND PRESSURE SENSORS ON SINGLE CHIP

CROSS REFERENCE

This application claims the benefit of U.S. Provisional Application No. 61/862,370 filed Aug. 5, 2013, the entire contents of which is herein incorporated by reference.

FIELD OF THE INVENTION

This disclosure relates generally to wafers and substrates such as those used for microelectromechanical system (MEMS) devices or semiconductor devices.

BACKGROUND

Electrostatic MEMS resonators have been a promising technological candidate to replace conventional quartz crystal resonators due to the potential for smaller size, lower power consumption and low-cost silicon manufacturing. Such devices typically suffer, however, from unacceptably large motional-impedance ($R_x$). MEMS devices operating in the out-of-plane direction, i.e., a direction perpendicular to the plane defined by the substrate on which the device is formed, have the advantage of large transduction areas on the top and bottom surfaces, resulting in a reduction in motional-impedances. Consequently, out-of plane devices have received an increasing amount of attention resulting in significant advances in areas such as digital micro-mirror devices and interference modulators.

The potential benefit of out-of-plane electrodes is apparent upon consideration of the factors which influence the $R_x$. The equation which describes $R_x$ is as follows:

$$R_x = \frac{c_r}{\eta^2}; \text{ with } \eta = V\frac{\partial C}{\partial g} = \frac{\varepsilon_0 A V}{g^2}$$

wherein "$c_r$" is the effective damping constant of the resonator,
   "$\eta$" is the transduction efficiency,
   "g" is the gap between electrodes,
   "A" is the transduction area, and
   "V" is the bias voltage.

For in-plane devices, "A" is defined as H×L, with "H" being the height of the in-plane component and "L" being the length of the in-plane component. Thus, $\eta$ is a function of H/g and H/g is constrained by the etching aspect ratio which is typically limited to about 20:1. For out-of-plane devices, however, "A" is defined as L×W, with "W" being the width of the device. Accordingly, $\eta$ is not a function of the height of the out-of-plane device. Rather, $\eta$ is a function of (L×W)/g. Accordingly, the desired footprint of the device is the major factor in transduction efficiency. Out-of-plane devices thus have the capability of achieving significantly greater transduction efficiency compared to in-plane devices.

The encapsulation of the inertial sensor is a standard process, e.g., performed by waferbonding. This is needed in order to protect the sensor structure from environmental influences and in order to provide an optimal operation pressure. Accelerometers typically have a higher pressure (>10 mbar) in order to provide sufficient damping. Gyroscopes have a lower pressure (<10 mbar) in order to operate efficiently. The encapsulation process is not further described herein or shown in the figures.

Additionally, MEMS sensors are generally fabricated using dedicated process flows for each sensor with each sensor on a unique chip. For example, a pressure sensor is fabricated with a completely different process flow than an inertial sensor and, as a result, it is difficult to fabricate both sensors on a single chip.

What is needed is a device that is fabricated using commonly understood fabrication steps that combines multiple sensing devices of different types on a single chip. It would be beneficial if the device could be realized using a single fabrication process on one single chip.

SUMMARY

The disclosure advantageously combines the process flows for multiple MEMS sensors, so that they are fabricated on a single chip. For example, some embodiments use the process flow for a capacitive pressures sensor and fabricate an inertial sensor in parallel with fabrication of the pressure sensor. In this way, an inertial sensor is realized within the membrane layer of the pressure sensor. The device layer is simultaneously used as z-axis electrode for out-of-plane sensing in the inertial sensor, and/or as the wiring layer for the inertial sensor. The membrane layer (or cap layer) of the pressure sensor process flow are used to define the inertial sensor sensing structures. Insulating nitride plugs in the membrane layer are used to electrically decouple the various sensing structures for a multi-axis inertial sensor, allowing for fully differential sensing/readout. Additionally, by fabricating the inertial sensor within the membrane layer, there is a reduction in the overall sensor area. Such inertial sensing structures have the same design flexibility as current inertial sensors, such as allowing for large lateral gaps without additional process steps.

Other process flows may be adapted to the membrane layer of a pressure sensor process flow, allowing for many sensors to be integrated into a single process flow and a single chip. Additionally, the present disclosure is not limited to a capacitive pressure sensor process flow and can also be applied to other transducers, such as piezo-resistive transducers. Further, the present disclosure is not limited to the use of a poly-crystalline silicon membrane.

In one embodiment A MEMS sensor device includes a handle layer, a device layer located above the handle layer and in some embodiments spaced apart from the handle layer by a buried oxide layer, a first fixed electrode defined in the device layer, a second fixed electrode defined in the device layer and electrically isolated from the first fixed electrode, a cap layer located above the device layer, a first movable electrode defined in the cap layer at a location directly above the first fixed electrode, a second movable electrode defined in the cap layer, at least partially directly above the second fixed electrode, and electrically isolated from the first movable electrode, a first void located directly between the first fixed electrode and the first movable electrode, the first void sealed from an atmosphere above the cap layer, and a second void located directly between the second fixed electrode and the second movable electrode, the second void open to the atmosphere.

In some MEMS sensor devices, a first portion of the cap layer supporting the first movable electrode has a first minimum thickness, a second portion of the cap layer supporting the second movable electrode has a second minimum thickness, and the first minimum thickness is less than the first minimum thickness.

In some of the above embodiments, a maximum thickness of the first movable electrode is substantially identical to a maximum thickness of the second movable electrode.

In some of the above embodiments, the first void includes a first void portion positioned directly between the first fixed electrode and the first movable electrode, and a second void portion extending upwardly from the first void portion into the cap layer.

In some of the above embodiments, a maximum thickness of the first movable electrode is less than a maximum thickness of the second movable electrode.

In some of the above embodiments, an uppermost surface of the first movable electrode is below an uppermost surface of the second movable electrode.

In some of the above embodiments, the first movable electrode is defined at least in part by a first nitride portion extending vertically upwardly from a portion of the first void, and a second nitride portion extending horizontally from the first nitride portion.

In some of the above embodiments, the first movable electrode is further defined at least in part by a third nitride portion extending vertically upwardly from the second nitride portion.

In some of the above embodiments, the second movable electrode includes a first movable electrode portion directly above the second fixed electrode, a second movable electrode portion horizontally offset from the second fixed electrode, and a nitride spacer electrically isolating the first movable electrode portion from the second movable electrode portion, the MEMS sensor device further including a third fixed electrode defined in the cap layer adjacent to the second movable electrode portion.

In some of the above embodiments, the first fixed electrode and the first movable electrode are configured as a pressure sensor, and the second fixed electrode and the second movable electrode are configured as a gyroscope sensor.

In some of the above embodiments, the first fixed electrode and the first movable electrode are configured as a pressure sensor, and the second fixed electrode and the second movable electrode are configured as an accelerometer sensor.

In accordance with another embodiment, a method of forming a MEMS sensor device, includes defining a first fixed electrode in a device layer located above a handle layer, defining a second fixed electrode in the device layer at the same time that the first fixed electrode is defined, defining a first movable electrode in a cap layer above the device layer, the first movable electrode at a location directly above the first fixed electrode, defining a second movable electrode in the cap layer, the second movable electrode at least partially directly above the second fixed electrode, and electrically isolated from the first movable electrode, releasing the first movable electrode from the device layer by forming a first void, sealing the first void from an atmosphere above the cap layer, releasing the second movable electrode from the device layer by forming a second void, and opening the second void to the atmosphere.

In some of the above embodiments, releasing the second movable electrode occurs during the same process step as releasing the first movable electrode.

In some of the above embodiments, releasing the second movable electrode occurs during a process step subsequent to releasing the first movable electrode.

In some of the above embodiments, a method includes isolating a first portion of the second movable electrode from a second portion of the second movable electrode, wherein the first portion is directly above the second fixed electrode, and defining a third fixed electrode in the cap layer at a location adjacent to the second portion.

In some of the above embodiments, defining a first movable electrode includes forming a lower nitride portion within the cap layer, the lower nitride portion extending upwardly from a buried oxide layer, forming a gasket portion above the lower nitride portion, and forming an upper nitride portion within the cap layer, the upper nitride portion extending upwardly from the gasket.

In some of the above embodiments, a method includes etching a portion of the cap layer directly above the defined first movable electrode to provide a reduced thickness membrane in which the first movable electrode is defined.

In some of the above embodiments, releasing the first movable electrode from the device layer includes forming a first void portion located directly between the defined first fixed electrode and the defined first movable electrode, and forming a second void portion extending upwardly from the first void portion within the cap layer.

In some of the above embodiments, a method includes defining a third fixed electrode in the device layer at the same time that the first fixed electrode is defined, and defining a third movable electrode in the cap layer, the third movable electrode at least partially directly above the third fixed electrode, and electrically isolated from the second movable electrode.

DESCRIPTION

Figure 1:
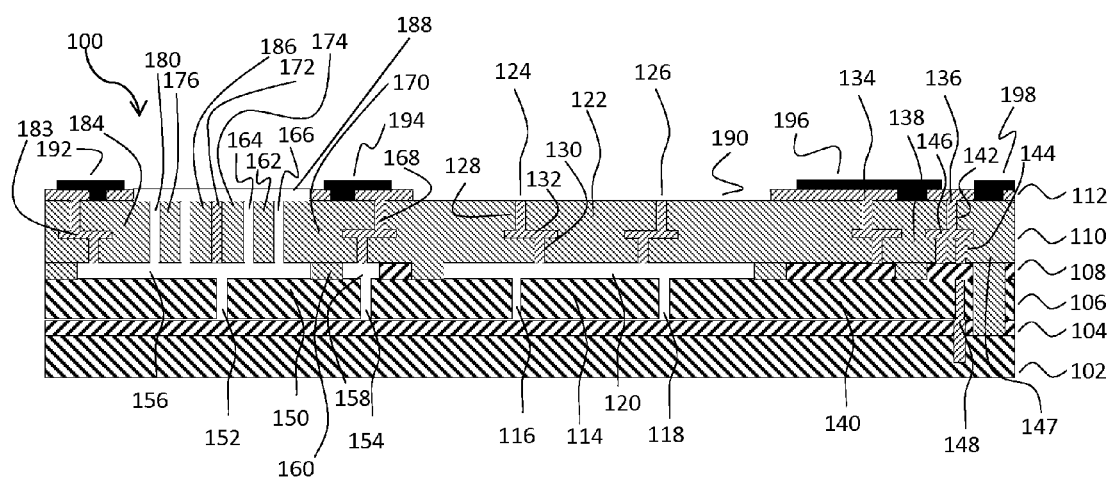
FIG. 1 depicts a side cross-sectional view of a sensor device incorporating in-plane and out-of-plane inertial sensors and a pressure sensor on a single chip.

For the purposes of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art which this disclosure pertains.

FIG. 1 depicts an inertial and pressure sensor 100 including a handle layer 102, a buried oxide layer 104, and a device layer 106. An oxide layer 108 separates the device layer 106 from a cap layer 110. A remainder of a passivation layer 112 is located above the cap layer 110.

Within the device layer 106, a lower pressure sensor electrode 114 is defined by two etch portions 116 and 118. While the description discusses etch portions 116 and 118 separately, it is understood that in at least some embodiments, the etch portions 116 and 118 are a single etch portion bounding the electrode 114. The lower pressure sensor electrode 114 is isolated from the cap layer 110 by an etched portion 120 of the oxide layer 108. The etched portions 116, 118, and 120 are released through vent holes that are sealed by the cap layer 110 as discussed in more detail below. Sealing of the vent holes provides a closed void including the etched portions 116, 118, and 120.

An upper pressure sensor electrode 122 is located above the lower pressure sensor electrode 114 and electrically and mechanically isolated from the lower pressure sensor electrode by the etched portion 120. The upper pressure sensor electrode 122 is isolated from the rest of the cap layer 110 by two spacers 124 and 126. The spacers 124 and 126 extend from the upper surface of cap layer 110 to the etched portion 120 and include upper and lower nitride portions, 128 and 130, with a nitride gasket portion 132 between the upper and lower nitride portions, 128 and 130. While the description discusses spacers 124 and 126 separately, it is understood that in at least some embodiments, the spacers 124 and 126 are a single spacer bounding the electrode 122.

Spacers 134 and 136, extending from the passivation layer 112 to the oxide layer 108, electrically isolate a connector 138 in the cap layer 110 from the rest of the cap layer 110. The connector 138 is in electrical communication with an in-plane electrode portion 140, which is further connected to the lower pressure sensor electrode 114. Spacer 134 is formed like spacers 124 and 126. Spacer 136 is formed having an upper nitride portion 142, and two lower nitride portions 144 with a nitride gasket portion 146 between the upper and lower nitride portions, 142 and 144. A connector 147 extends from the passivation layer 112 to the handle layer 102. The connector 147 is defined in the cap layer 110 by the spacer 136 and in the device layer by an isolation post 148. Isolation post 148 extends from oxide layer 108, beneath spacer 136, through the device layer 106, through the buried oxide layer 104, and into the handle layer 102.

Within the device layer 106, a lower inertial sensor electrode 150 for out-of-plane sensing is defined by two etched portions 152 and 154. While the description discusses etch portions 152 and 154 separately, it is understood that in at least some embodiments, the etch portions 152 and 154 are a single etch portion bounding the electrode 150. The lower inertial sensor electrode 150 is electrically isolated from the cap layer 110 by etched portions 156 and 158 of the oxide layer 108, except by a contact portion 160. The etched portions 152, 154, 156, and 158 are released through vent holes. The vent holes remain open, thereby creating a void which is open, i.e., in fluid communication with the atmosphere above the cap layer. It is furthermore possible, to release said etched portions after the trenches 180 etc. are made with a separate release etching process. This procedure has the advantage, that the sacrificial layer can then also be used as an etch-stop for the trenches 180, etc.

A sensing structure 162 for out-of-plane sensing (similar structures can be used for in-plane sensing: counter electrode is then also in-plane similar to sensing structure) is located above the lower inertial sensor electrode 150, and electrically and mechanically isolated from the lower inertial sensor electrode 150 by etched portion 156. The sensing structure 162 is mechanically and electrically isolated from a portion of the cap layer 110 on one side by etched portion 166, which extends completely from the upper surface of the cap layer 110 to the etched portion 156. The etched portion 166 and a spacer 168, which is formed like the spacers 124 and 126, electrically isolate a connector 170 in the cap layer 110 from the rest of the cap layer 110. The connector 170 is in electrical communication with the lower inertial sensor electrode 150, via the contact portion 160. A spacer 172, which consists of a nitride portion extending from the upper surface of the cap layer 110 to the etched portion 156, electrically isolates the sensing structure 162 from a sensing structure 176, while providing a mechanical coupling thereof. This allows fully differential capacitive sensing/readout.

The sensing structure 176 provides in-plane or out-of plane sensing and is located in the cap layer 110 and is isolated from the device layer 106 by etched portion 156. The sensing structure 176 is mechanically and electrically isolated on one side from the rest of the cap layer 110 by etched portion 180, which extends completely from the upper surface of the cap layer 110 to the etched portion 156. The etched portion 180 and a spacer 183, which is formed like the spacers 124 and 126, electrically isolate an upper inertial sensor electrode 184 in the cap layer 110 from the rest of the cap layer 110.

A wide etched portion 188 exposes the upper surface of the cap layer revealing sensing structures 162 and 176. A wide etched portion 190 exposes the upper surface of the cap layer revealing the upper pressure sensor electrode 122. A bond pad 192 is connected through the passivation layer 112 to the upper inertial sensor electrode 184. A bond pad 194 is connected through the passivation layer 112 to the connector 170, which is further connected to the lower inertial sensor electrode 150. A bond pad 196 is connected through the passivation layer 112 to the connector 138, which is further connected to the lower pressure sensor electrode 114. A bond pad 198 is connected through the passivation layer to the connector 147.

Figure 2:
FIGS. 2-21 depict side cross-sectional views of a fabrication process for the sensor device of FIG. 1.
Figure 3:
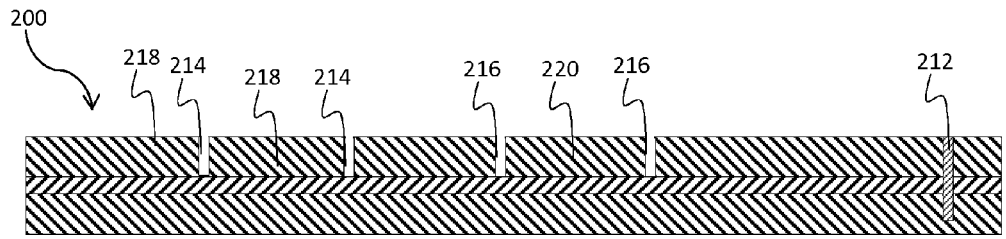

A process for forming a sensor such as the inertial and pressure sensor 100 is discussed with reference to FIGS. 2-21. Referring initially to FIG. 2, an SOI wafer 200 including a handle layer 202, a buried oxide layer 204, and a device layer 206 is provided and etched with a trench 208 to define a connector 210. The trench 208 is then filled with a trench nitride portion 212 and trenches 214 and 216 are etched (FIG. 3). The trenches 214 define lower electrode 218 for out-of-plane inertial sensing while the trenches 216 define a lower pressure electrode 220.

Figure 4:
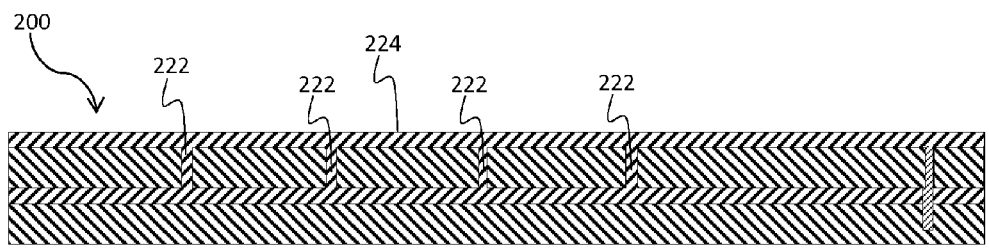

The trench portions 214 and 216 are then filled with a trench oxide portion 222 as shown in FIG. 4 using a conformal oxide deposition. The filled trenches define the fixed electrodes in the device layer. While only two are formed in this embodiment, additional electrodes may be defined for particular applications. Oxide deposition further results in an oxide layer 224 on the upper surface of the device layer 206. The oxide layer 224 may be planarized by any desired technique such as chemical mechanical polishing (CMP).

Figure 5:
Figure 6:

A trench 226 is etched through the oxide layer 224, the device layer 206, and the buried oxide layer 204 to expose the upper surface of the handle layer 202 (FIG. 5). An epi-polysilicon deposition 228 fills the trench 226 (FIG. 6) and additional trenches 230, 232, 234, 236, and 238 are etched through the oxide layer 224.

Figure 7:
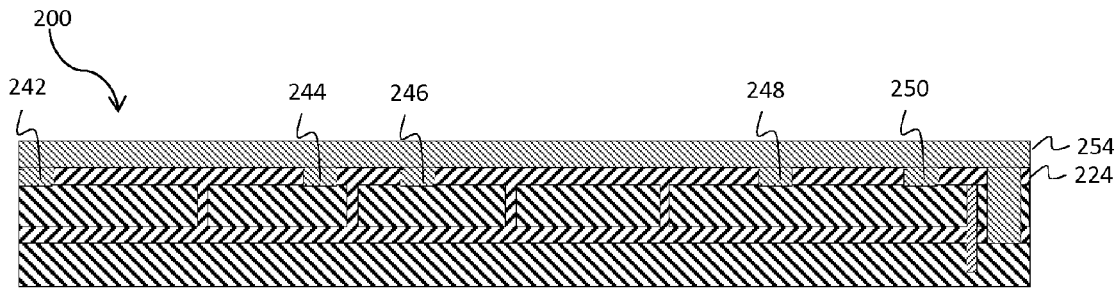
Figure 8:
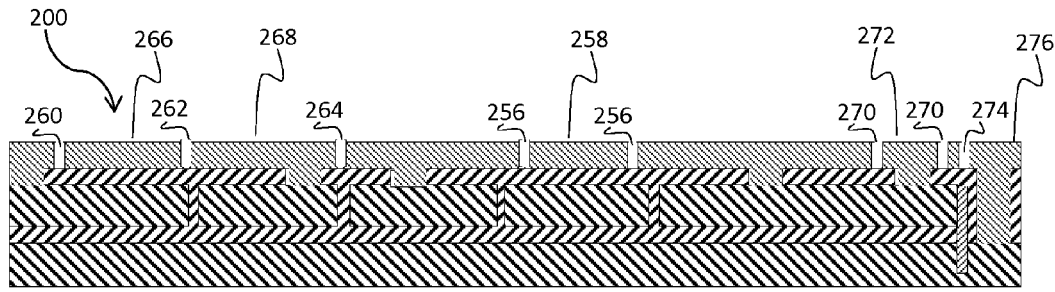

Referring to FIG. 7, an epi-polysilicon deposition fills the contact openings 230, 232, 234, 236, and 238 with lower middle contact portions 242, 244, 246, 248, and 250. The epi-polysilicon deposition further results in a lower cap layer portion 254 above the oxide layer 224. A number of trenches are then etched into the cap layer portion 254. A trench 256 is etched after CMP of the lower cap layer portion 254 (FIG. 8). The trench 256 extends from the upper surface of the lower cap layer portion 254 to the upper surface of the oxide layer 224 to define an upper electrode 258 for pressure sensing. Trenches 260, 262, and 264 are similarly etched to define an in-plane inertial sensing portion 266 between trenches 260 and 262, and to define an out-of-plane inertial sensing portion 268 between trenches 262 and 264.

Figure 9:
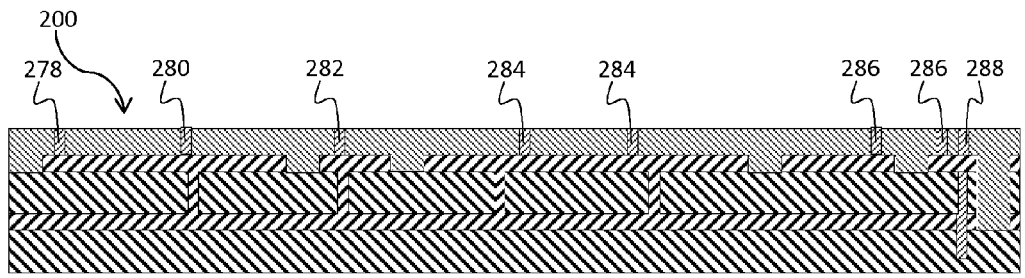

Trench 270 is similarly etched to define a middle contact portion 272, which is connected with lower middle contact portion 250 (see FIG. 7). Finally, trench 274 is similarly etched to define a middle contact portion 276, which is connected to lower contact portion 228 (see FIG. 6). Trenches 256, 260, 262, 264, 270, and 274 are then filled with a low stress nitride to create trench nitride portions 278, 280, 282, 284, 286, and 288, as shown in FIG. 9.

Figure 10:
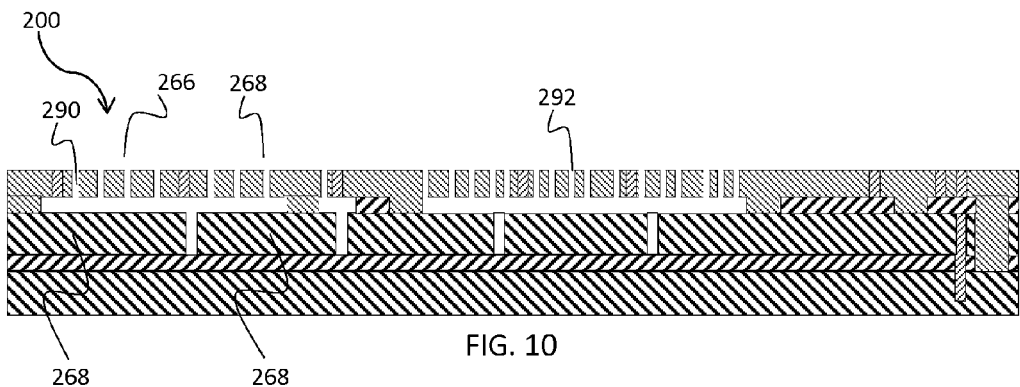
Figure 11:
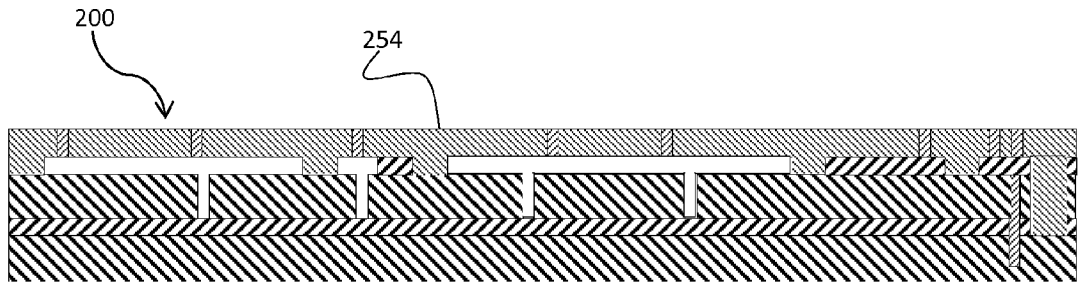
Figure 12:
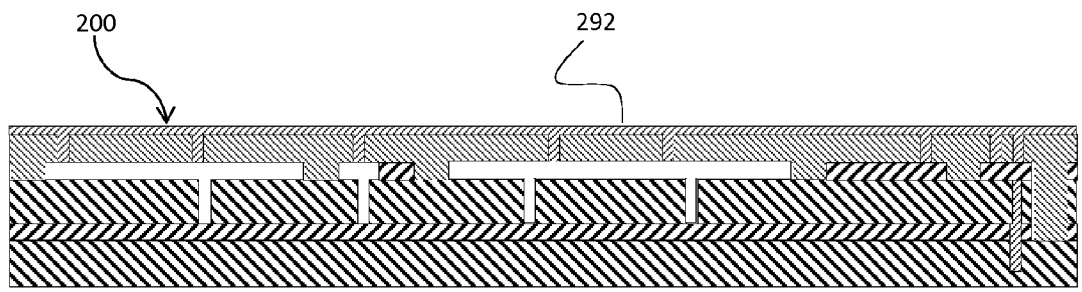

Referring to FIG. 10, after vent holes 290 and 292 are formed, an HF vapor etch release is performed which releases the in-plane inertial sensing portion 266 and the out-of-plane inertial sensing portions 268. The upper pressure sensor electrode 122 is also released by the vapor etch. This step thus sets the corresponding gaps between sensing electrodes and structures. A clean high temperature seal is then performed in an epi-reactor to seal the vent holes 290/292. Alternatively, the vent holes 290/292 may be sealed using oxide, nitride, silicon migration, etc. The resulting configuration is shown in FIG. 11 wherein lower cap layer portion 254 has been reformed after the HF vapor release.

Figure 13:
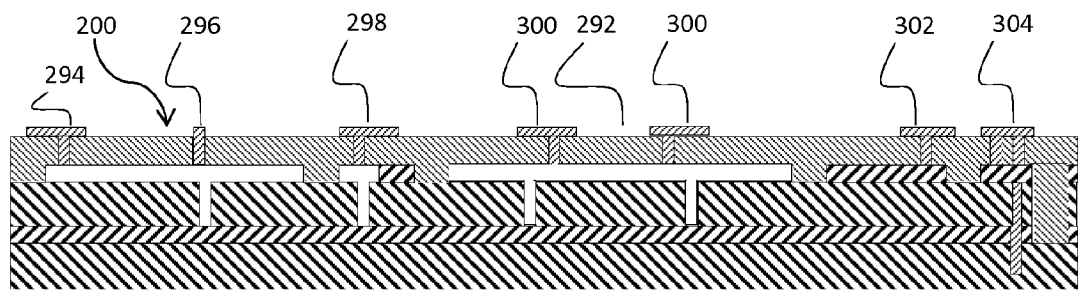

A low stress nitride layer 292 is then deposited on the upper surface of the lower cap layer portion 254 (FIG. 12), and then planarized. The nitride layer 292 is patterned and etched resulting in the configuration of FIG. 13. In FIG. 13, remainders of the nitride layer 292 form gaskets 294, 296, and 298. Additional remainders of the nitride layer 292 form a gasket 300 for the upper electrode 258, and gaskets 302 and 304 for the middle contact portion 272 and the middle contact portion 276. The lateral extent of gaskets 294, 296, 298, 300, 302, and 304 when viewed in the cross-section may be selected to provide the desired isolation characteristics for the components defined thereby.

Figure 14:
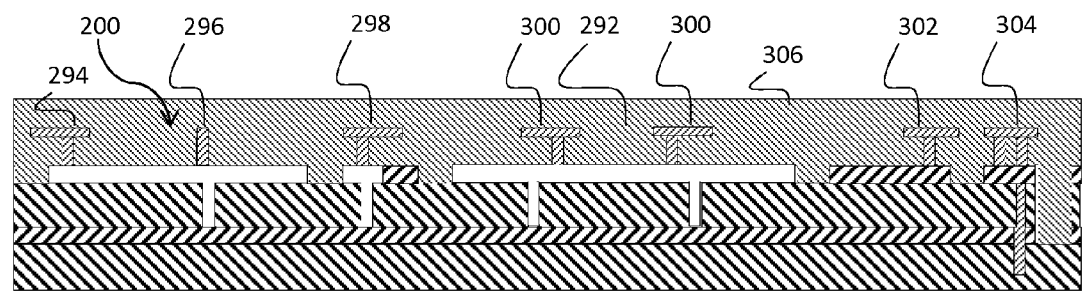

An epi-polysilicon layer is then formed on the upper surface of the lower cap layer portion 254 and the upper surface of the gaskets 294, 296, 298, 300, 302, and 304 to form an upper cap layer portion 306 (FIG. 14). The upper cap layer portion 306 may be planarized if desired.

Figure 15:
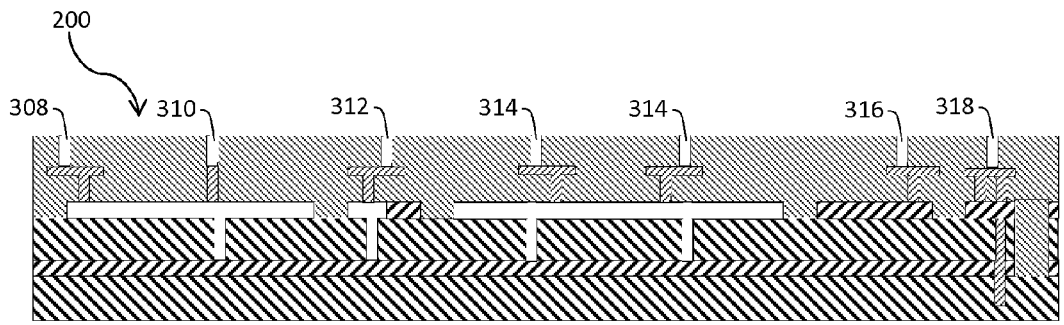

Trenches 308, 310, 312, 314, 316, and 318 are then etched as depicted in FIG. 15. The trench 308 extends from the upper surface of the upper cap layer portion 306 to the upper surface of gasket 294 which acts as an etch stop. The trench 310 extends from the upper surface of the upper cap layer portion 306 to the upper surface of gasket 296 which acts as an etch stop. The trench 312 extends from the upper surface of the upper cap layer portion 306 to the upper surface of gasket 298 which acts as an etch stop. The trench 314 extends from the upper surface of the upper cap layer portion 306 to the upper surface of gasket 300 which acts as an etch stop. The trench 316 extends from the upper surface of the upper cap layer portion 306 to the upper surface of gasket 302 which acts as an etch stop. The trench 318 extends from the upper surface of the upper cap layer portion 306 to the upper surface of gasket 304 which acts as an etch stop.

Figure 16:
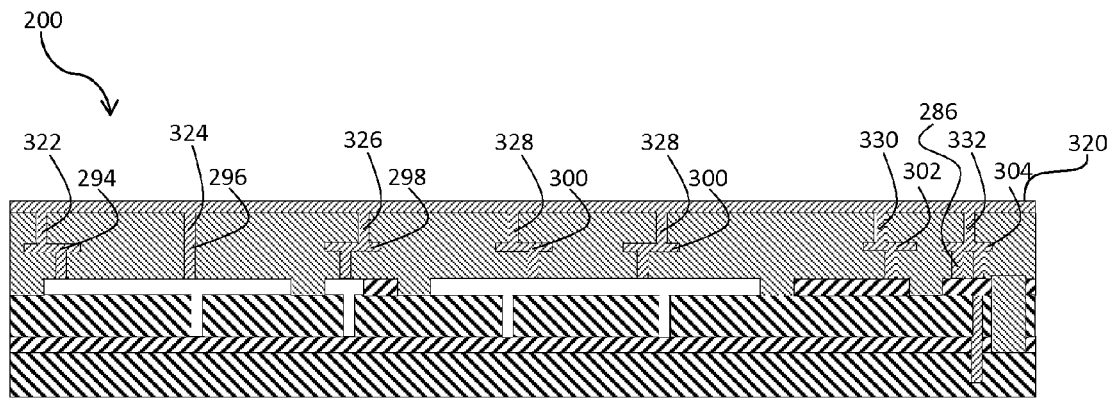

A nitride passivation layer 320 is then deposited on the upper surface of the upper cap layer portion 306 as shown in FIG. 16. The deposited nitride also fills the trenches 308, 310, 312, 314, 316, and 318 with passivation portions 322, 324, 326, 328, 330, and 332. While not shown in FIG. 16, in some embodiments a gasket such as the gasket 300 is also provided for the passivation portion 300.

Figure 17:
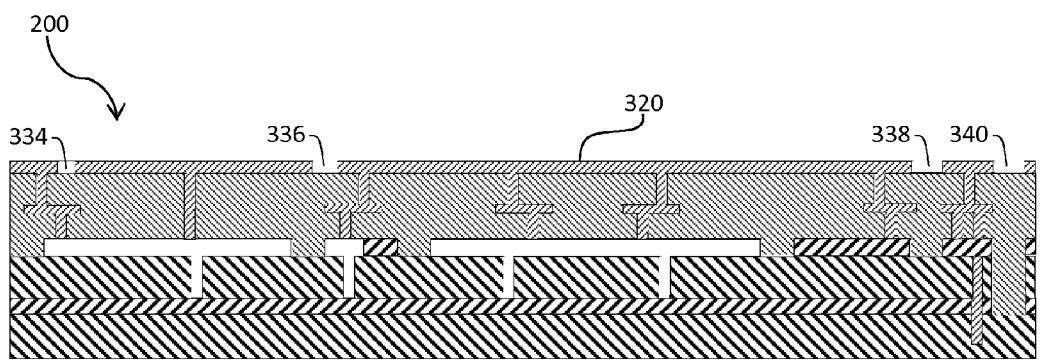
Figure 18:
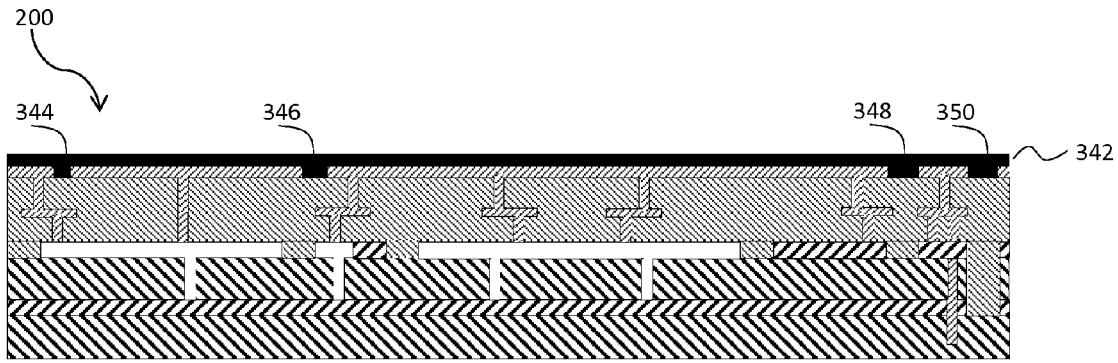
Figure 19:
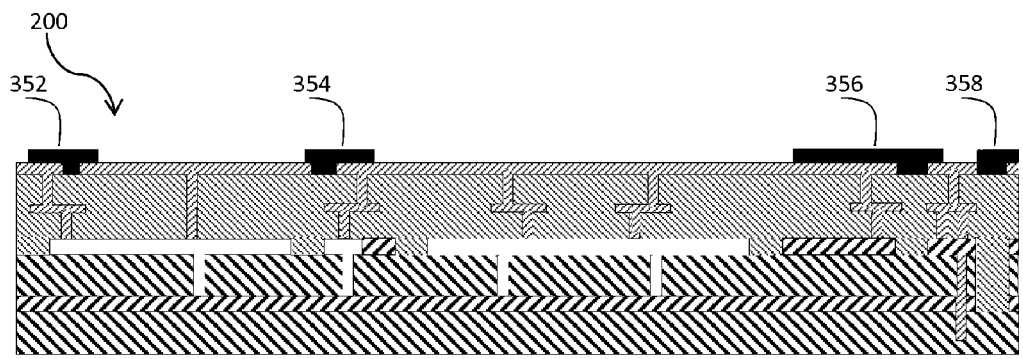

Contact openings 334, 336, 338, and 340 are then etched through the nitride passivation layer 320 (FIG. 17). As shown in FIG. 19, a metal layer 342 is then deposited on the passivation layer 320. The metal layer 342 also fills the contact openings 334, 336, 338, and 340 with metal contact portions 344, 346, 348, and 350. The metal layer 342 is then patterned and etched resulting in the configuration of FIG. 19. In FIG. 19, a remainder of the metal layer 342 forms a bond pad 352 for the in-plane inertial sensing portion 266. A remainder of the metal layer 342 forms a bond pad 354 for the out-of-plane inertial sensing portion 268. A remainder of the metal layer 342 forms a bond pad 356 for the middle contact portion 272. A remainder of the metal layer 342 forms a bond pad 358 for the middle contact portion 276.

Figure 20:
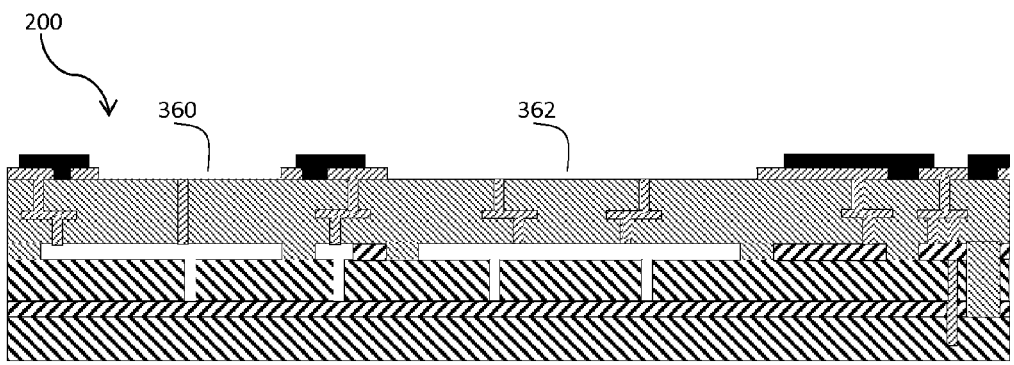

The passivation layer 320 is then patterned and etched resulting in the configuration of FIG. 20. In FIG. 20, wide etched portion 360 substantially reveals the upper surface of the in-plane inertial sensing portion 266 and the out-of-plane inertial sensing portion 268. There is also a wide etched portion 362 completely revealing the upper electrode 258 and some of the surrounding portions of the upper cap layer portion 306.

Figure 21:
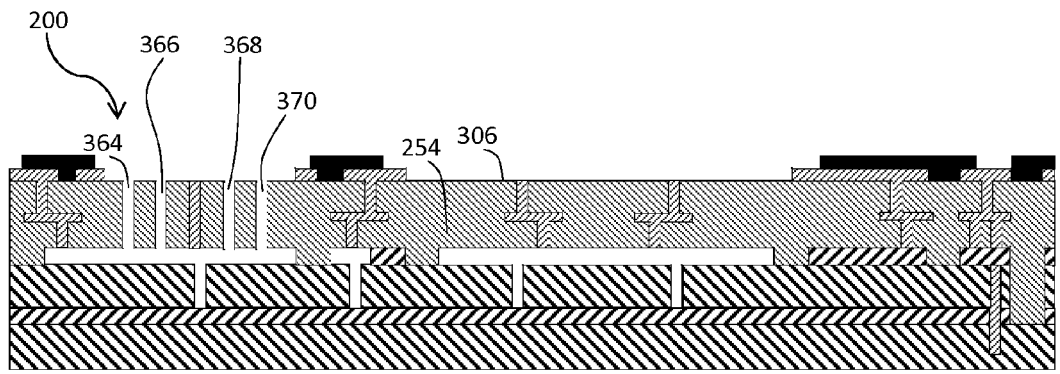

Referring to FIG. 21, trenches 364, 366, 368, and 370 are etched entirely through upper cap layer portion 306 and the lower cap layer 254 portion. The structure of FIG. 21 is the same as the structure of the inertial and pressure sensor 100 of FIG. 1.

The above described process may be modified in a number of ways to provide additional features. For example, in embodiments wherein the release of layer 224 happens in the inertial sensor region after the steps discussed with respect to FIG. 21, the trench for passivation portion 324 (when there is no gasket associated with the passivation portion 324) can be formed in one single step along with the trenches described with respect to FIG. 15.

As another example, in some embodiments the passivation layer 320 is not etched as discussed above with respect to FIG. 20. Rather, the passivation layer 320 is left in place in order to protect the pressure sensor, and/or to be used as a hardmask for the inertial sensor patterning discussed above with respect to the trenches of FIG. 21.

Figure 22:
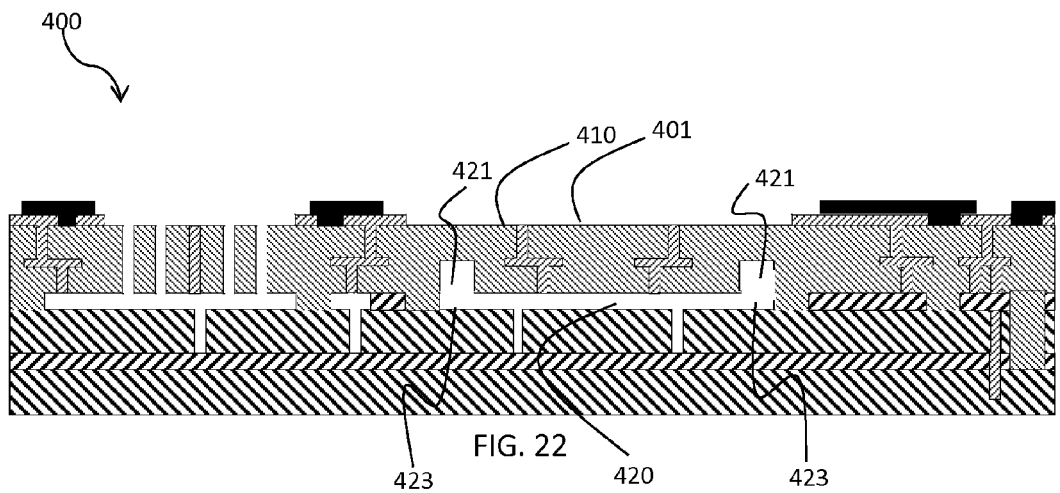
FIG. 22 depicts a side cross-sectional view of a sensor device similar to that of FIG. 1 wherein the pressure sensor membrane has a boss-like formation, thereby reducing the effective thickness of the pressure sensor membrane.

Moreover, it is sometimes beneficial to have a large structural layer thickness for an inertial sensor area and a lower structural thickness in a pressure sensor area in order to have good sensitivity for both sensors. A pressure sensor membrane is preferably 8-12 μm thick, while the inertial sensor functional layer is preferably 10-40 μm thick. FIG. 22 depicts an inertial and pressure sensor 400 wherein the effective thickness of a pressure sensor membrane 401 has been reduced.

The inertial and pressure sensor 400 is similar to the inertial and pressure sensor 100, shown in FIG. 1, and shares all the structural features of the inertial and pressure sensor 100. The difference between the inertial and pressure sensor 400 and the inertial and pressure sensor 100 is that the inertial and pressure sensor 400 has an etched portion 420 (which is corresponds with the etched portion 120 of the inertial and pressure sensor 100) that further comprises a raised portion 421. The raised portion 421 of the etch portion 420 is located at the outer edge 423 of the etched portion 420 and protrudes into the cap layer 410 (which corresponds with the cap layer 110 of the inertial and pressure sensor 100). The raised portion 421, as depicted, protrudes roughly halfway through the cap layer 410, but may be designed to modify the effective thickness of the pressure sensor membrane as desired. The reduced thickness of the cap layer 410 about the electrode in the membrane (cap layer 410) effectively reduces the membrane thickness. The raised portions 21 are readily formed simply by etching the cap layer portion 254 (at FIG. 7) and depositing additional oxide in the trenches. The remaining process steps are substantially identical.

Figure 23:
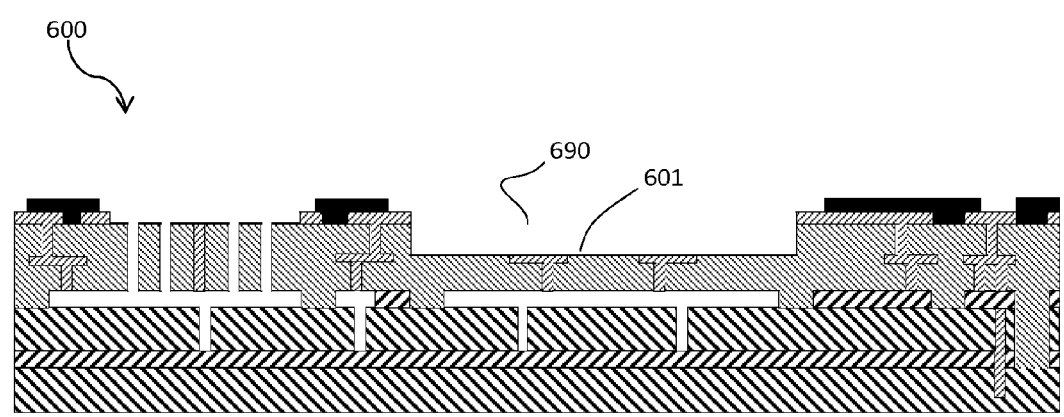
FIG. 23 depicts a side cross-sectional view of a sensor device similar to that of FIG. 1 wherein the wide etched portion that reveals the pressures sensor is etched deeper so that the pressure sensor membrane has a reduced thickness.

FIG. 23 depicts an alternative embodiment in which the effective thickness of the pressure sensor membrane has again been reduced. FIG. 23 depicts an inertial and pressure sensor 600 wherein the effective thickness of a pressure sensor membrane 601 has been reduced by etching a deeper wide etched portion 690 (which corresponds with wide etched portion 190 of sensor 100). The inertial and pressure sensor 600 is otherwise similar to the inertial and pressure sensor 100, shown in FIG. 1, and shares all the other structural features of the inertial and pressure sensor 100.

Figure 24:
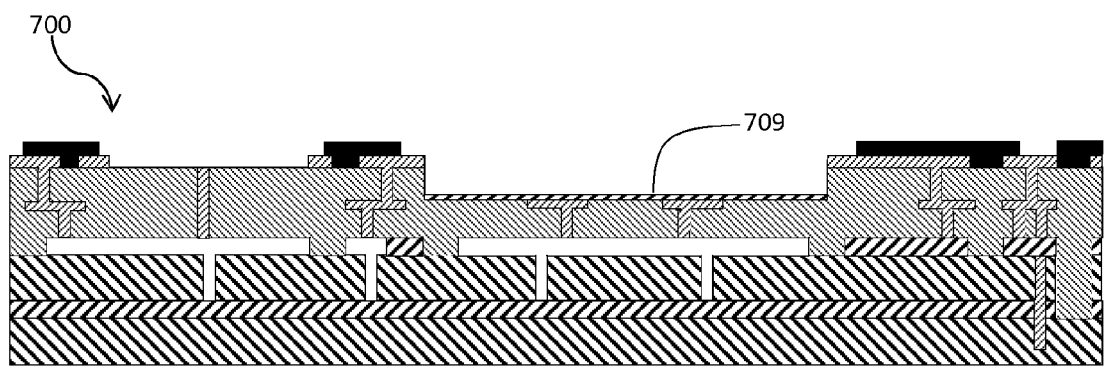
FIG. 24 depicts a modified process step, wherein a wide etched portion above the pressure sensor has been etched using the thin oxide layer as an etch stop.

The inertial and pressure sensor 600 can be fabricated substantially in the same manner as the inertial and pressure sensor 100. The main difference is that during the deposition of the EPI membrane-layer (i.e., between the configuration of FIGS. 13 and 14), a thin layer of oxide is deposited. This is used as a trench stop during the trench of the inertial sensor structures resulting in the configuration of FIG. 24 which shows an inertial and pressure sensor 600 with the thin layer of oxide 709. Using this modification, the membrane thickness can be reduced to the required thickness. The oxide layer 709 is removed during the release etch of the sensor structures in embodiments wherein the release of oxide layer 224 happens in the inertial sensor region after the steps discussed above with respect to FIG. 21, or during a separate release/etch step. Therefore, the process is modified to include only additional steps for oxide deposition and patterning.

In accordance with the above described embodiments, a pressure sensor and an accelerometer are fabricated on a single chip. In some embodiments, a pressures sensor and a gyroscope are fabricated on a single chip. The device of FIG. 1 can thus be configured as a pressure sensor and an accelerometer, or as a pressure sensor and a gyroscope. By providing another structure substantially like the structure to the left of the sensor electrodes 114 and 122, additional degrees of sensing are possible. Thus, in other embodiments, a 7-degree of freedom combination chip is fabricated having a pressure sensor, a 3-axis accelerometer, and a 3-axis gyroscope. In some embodiments, the chip has magnetometer functionality (e.g. hall sensor).

In some embodiments, a 10-degree of freedom combination chip is fabricated having a 3-axis magnetometer is realized on an application-specific integrated circuit (ASIC), as an add-on chip, or as a Lorentz-force magnetometer in the same process flow as the inertial sensor part on the same MEMS chip.

In some embodiments, encapsulation is done using wafer-bonding (metallic, eutectic, SLID, glass-frit) with an Si-cap wafer. In other embodiments, the Si-cap wafer of a wafer-bonding encapsulation is an ASIC chip.

In some embodiments, the chip has a bare-die packaging, and is an ASIC with through-silicon-vias. In some embodiments, the pressure sensor area is not covered by the cap wafer. In some embodiments, the cap wafer has an access port etched into it within the area of the pressure sensor in order to have a pressures port. In some embodiments, the chip has a membrane recess using an oxide layer within the EPI membrane layer as an etch stop. In some embodiments, the membrane has a boss formation using an oxide block formation prior to the membrane deposition.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A MEMS sensor device comprising:
   a handle layer;
   a device layer located above the handle layer;
   a first fixed electrode defined in the device layer;
   a second fixed electrode defined in the device layer and electrically isolated from the first fixed electrode;
   a cap layer located above the device layer;
   a first movable electrode defined in the cap layer at a location directly above the first fixed electrode;
   a second movable electrode defined in the cap layer, at least partially directly above the second fixed electrode, and electrically isolated from the first movable electrode;
   a first void located directly between the first fixed electrode and the first movable electrode, the first void sealed from an atmosphere above the cap layer; and
   a second void located directly between the second fixed electrode and the second movable electrode, the second void open to the atmosphere.

2. The MEMS sensor device of claim 1, wherein:
   a first portion of the cap layer supporting the first movable electrode has a first minimum thickness;
   a second portion of the cap layer supporting the second movable electrode has a second minimum thickness; and
   the first minimum thickness is less than the second minimum thickness.

3. The MEMS sensor device of claim 2, wherein a maximum thickness of the first movable electrode is substantially identical to a maximum thickness of the second movable electrode.

4. The MEMS sensor device of claim 3 the first void comprising:
   a first void portion positioned directly between the first fixed electrode and the first movable electrode; and
   a second void portion extending upwardly from the first void portion into the cap layer.

5. The MEMS sensor device of claim 2, wherein a maximum thickness of the first movable electrode is less than a maximum thickness of the second movable electrode.

6. The MEMS sensor device of claim 5, wherein an uppermost surface of the first movable electrode is below an uppermost surface of the second movable electrode.

7. The MEMS sensor device of claim 1, wherein the first movable electrode is defined at least in part by:
   a first nitride portion extending vertically upwardly from a portion of the first void; and
   a second nitride portion extending horizontally from the first nitride portion.

8. The MEMS sensor device of claim 7, wherein the first movable electrode is further defined at least in part by:
   a third nitride portion extending vertically upwardly from the second nitride portion.

9. The MEMS sensor device of claim 7, wherein the second movable electrode comprises:
   a first movable electrode portion directly above the second fixed electrode;
   a second movable electrode portion horizontally offset from the second fixed electrode; and
   a nitride spacer electrically isolating the first movable electrode portion from the second movable electrode portion, the MEMS sensor device further including:
   a third fixed electrode defined in the cap layer adjacent to the second movable electrode portion.

10. The MEMS sensor device of claim 1, wherein:
    the first fixed electrode and the first movable electrode are configured as a pressure sensor; and the second fixed electrode and the second movable electrode are configured as a gyroscope sensor.

11. The MEMS sensor device of claim 1, wherein:
the first fixed electrode and the first movable electrode are configured as a pressure sensor; and
the second fixed electrode and the second movable electrode are configured as an accelerometer sensor.

12. The MEMS sensor device of claim 1, further comprising:
a connector portion extending vertically from an upper surface of the cap portion to an upper surface of second electrode, the connector portion in electrical communication with the second electrode.

\* \* \* \* \*